United States Patent
Tsai et al.

(10) Patent No.: US 10,141,398 B1
(45) Date of Patent: Nov. 27, 2018

(54) HIGH VOLTAGE MOS STRUCTURE AND ITS MANUFACTURING METHOD

(71) Applicant: UNITED MICROELECTRONICS CORP., Hsinchu (TW)

(72) Inventors: Ming-Hua Tsai, New Taipei (TW); Jung Han, New Taipei (TW); Chin-Chia Kuo, Tainan (TW); Wen-Fang Lee, Hsinchu (TW); Chih-Chung Wang, Hsinchu (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/844,942

(22) Filed: Dec. 18, 2017

(51) Int. Cl.
| | |
|---|---|
| *H01L 27/118* | (2006.01) |
| *H01L 29/06* | (2006.01) |
| *H01L 29/78* | (2006.01) |
| *H01L 29/10* | (2006.01) |
| *H01L 21/28* | (2006.01) |
| *H01L 29/08* | (2006.01) |
| *H01L 29/423* | (2006.01) |
| *H01L 29/49* | (2006.01) |

(52) U.S. Cl.
CPC .... *H01L 29/0638* (2013.01); *H01L 21/28035* (2013.01); *H01L 29/0653* (2013.01); *H01L 29/0692* (2013.01); *H01L 29/0847* (2013.01); *H01L 29/1041* (2013.01); *H01L 29/42372* (2013.01); *H01L 29/4916* (2013.01); *H01L 29/4983* (2013.01); *H01L 29/7833* (2013.01)

(58) Field of Classification Search
CPC ............ H01L 29/0638; H01L 29/4983; H01L 29/4916; H01L 29/42372; H01L 29/0847; H01L 21/28035; H01L 29/1041; H01L 29/7833; H01L 29/0692; H01L 29/0653
See application file for complete search history.

(56) References Cited

U.S. PATENT DOCUMENTS

| | | | |
|---|---|---|---|
| 7,244,975 B2 | 7/2007 | Chen et al. | |
| 9,406,771 B1 | 8/2016 | Hsiao et al. | |
| 2003/0001219 A1* | 1/2003 | Chau | H01L 29/41783 257/412 |
| 2008/0315281 A1* | 12/2008 | Park | H01L 27/105 257/315 |
| 2012/0104405 A1* | 5/2012 | Choi | H01L 27/124 257/72 |

(Continued)

*Primary Examiner* — Stephen Bradley
*Assistant Examiner* — Wasiul Haider
(74) *Attorney, Agent, or Firm* — WPAT, PC (57) ABSTRACT

A semiconductor structure includes a HV NMOS structure. The HV NMOS structure includes a source region, a drain region, a channel region, a gate dielectric, and a gate electrode. The source region and the drain region are separated from each other. The channel region is disposed between the source region and the drain region. The channel region has a channel direction from the source region toward the drain region. The gate dielectric is disposed on the channel region and on portions of the source region and the drain region. The gate electrode is disposed on the gate dielectric. The gate electrode includes a first portion of n-type doping and two second portions of p-type doping. The two second portions are disposed at two sides of the first portion. The two second portions have an extending direction perpendicular to the channel direction.

13 Claims, 8 Drawing Sheets

(56) References Cited

U.S. PATENT DOCUMENTS

2012/0205751 A1* 8/2012 Ohguro ............. H01L 29/42368
257/411
2016/0118469 A1* 4/2016 Chen ............... H01L 21/823443
257/412

* cited by examiner

HIGH VOLTAGE MOS STRUCTURE AND ITS MANUFACTURING METHOD

TECHNICAL FIELD

This disclosure relates to a semiconductor structure and a method for manufacturing the same. More particularly, this disclosure relates to a semiconductor structure comprising a high-voltage (HV) NMOS structure and a method for manufacturing the same.

BACKGROUND

The metal-oxide-semiconductor (MOS) devices have been widely used in integrated circuits for their small sizes, low cost of production, ease of integration, etc. The MOS devices can be made either p-type or n-type semiconductors, and complementary pairs thereof can be used to make switching circuits with very low power consumption. Typically, in a semiconductor structure, MOS devices are disposed in both the high voltage areas and the low voltage areas, and known as high-voltage (HV) MOS devices and low-voltage (LV) MOS devices, respectively. For the operation under various conditions such as different levels of voltages, the MOS devices and the related elements may have different modified structures.

SUMMARY

This disclosure is directed to a semiconductor structure comprising a high-voltage (HV) NMOS structure and a method for manufacturing the same.

According to some embodiments, a semiconductor structure comprises a HV NMOS structure. The HV NMOS structure comprises a source region, a drain region, a channel region, a gate dielectric, and a gate electrode. The source region and the drain region are separated from each other. The channel region is disposed between the source region and the drain region. The channel region has a channel direction from the source region toward the drain region. The gate dielectric is disposed on the channel region and on portions of the source region and the drain region. The gate electrode is disposed on the gate dielectric. The gate electrode comprises a first portion of n-type doping and two second portions of p-type doping. The two second portions are disposed at two sides of the first portion. The two second portions have an extending direction perpendicular to the channel direction.

According to some embodiments, a method for manufacturing a semiconductor structure comprises forming a HV NMOS structure. The formation of the HV NMOS structure comprises the following steps. First, a source region and a drain region are formed in a substrate. The source region and the drain region are separated from each other and define a channel region therebetween. The channel region has a channel direction from the source region toward the drain region. Then, a gate dielectric is formed on the channel region and on portions of the source region source region and the drain region. A gate electrode is formed on the gate dielectric. The formation of the gate electrode comprises the following steps. First, an intrinsic polysilicon layer is formed on the gate dielectric. The intrinsic polysilicon layer has a first portion and two second portions at two sides of the first portion. The two second portions have an extending direction perpendicular to the channel direction. Then, the first portion of the intrinsic polysilicon layer is implanted with a n-type dopant. The two second portions of the intrinsic polysilicon layer are implanted with a p-type dopant.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. For clarity, the components in the figures may not be drawn to scale. It is contemplated that elements and features of one embodiment may be beneficially incorporated in another embodiment without further recitation.

Figure 1A:
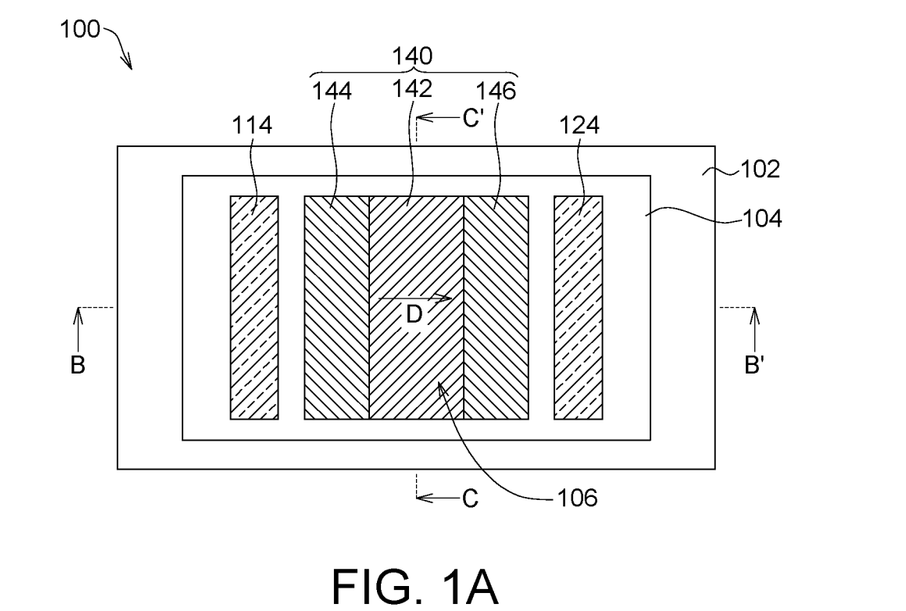
FIGS. 1A-1C show an exemplary semiconductor structure according to embodiments.
Figure 1B:
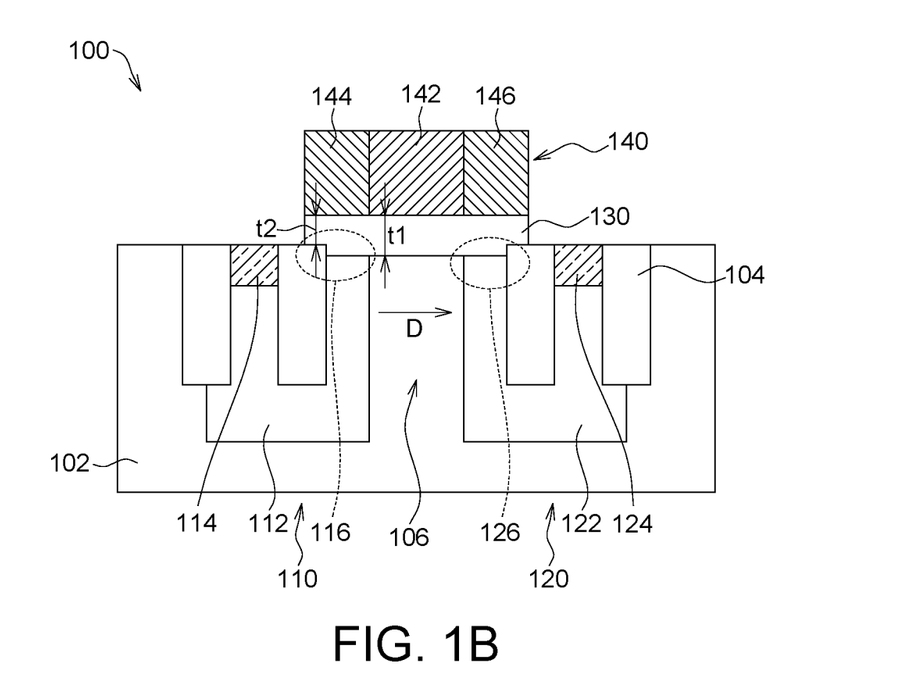
Figure 1C:
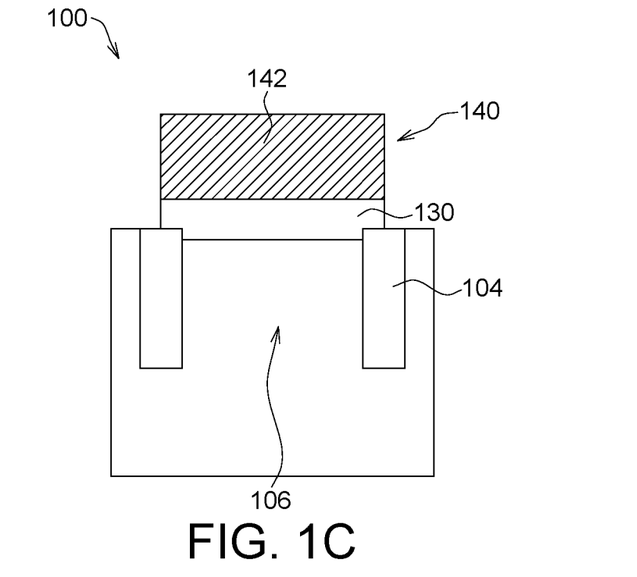

Referring to FIGS. 1A-1C, an exemplary semiconductor structure according to embodiments is shown, wherein FIG. 1A illustrates a top view, FIG. 1B illustrates a cross-sectional view along the line B-B' in FIG. 1A, and FIG. 1C illustrates a cross-sectional view along the line C-C' in FIG. 1A. This semiconductor structure comprises a HV NMOS structure 100. The HV NMOS structure 100 comprises a source region 110, a drain region 120, a channel region 106, a gate dielectric 130, and a gate electrode 140. The source region 110 and the drain region 120 are separated from each other. The channel region 106 is disposed between the source region 110 and the drain region 120. The channel region 106 has a channel direction D from the source region 110 toward the drain region 120. The gate dielectric 130 is disposed on the channel region 106 and on portions of the source region 110 and the drain region 120. The gate electrode 140 is disposed on the gate dielectric 130. The gate electrode 140 comprises a first portion 142 of n-type doping and two second portions 144 and 146 of p-type doping. The two second portions 144 and 146 are disposed at two sides of the first portion 142. As shown in FIG. 1A, the two second portions 144 and 146 have an extending direction perpendicular to the channel direction D.

More specifically, according to some embodiments, the HV NMOS structure 100 may comprise a substrate 102, a first n-type doped region 112, a second n-type doped region 122, an isolation structure 104, a first n-type heavily doped region 114, and a second n-type heavily doped region 124. The substrate may be a p-type substrate. The first n-type doped region 112 and the second n-type doped region 122 are disposed in the substrate 102 and separated from each other. The first n-type doped region 112 is disposed in the source region 110, and the second n-type doped region 122 is disposed in the drain region 120. The isolation structure 104 is disposed in the substrate 102. The isolation structure 104, such as a shallow trench isolation (STI) structure, has a first through opening and a second through opening in the first n-type doped region 112 and the second n-type doped region 122, respectively. The first n-type heavily doped region 114 and the second n-type heavily doped region 124 are disposed in the first through opening and the second through opening, respectively. As such, the first n-type heavily doped region 114 is disposed in the source region 110, and the second n-type heavily doped region 124 is disposed in the drain region 120.

The gate dielectric 130 has a central portion having a first thickness t1 and an edge portion having a second thickness t2 smaller the first thickness t1. More specifically, except for the edge portion on the isolation structure 104, the gate dielectric 130 is so thick that it is partially formed into the substrate 102 due to the manufacturing process. Such thick gate dielectric is suitable for a HV NMOS structure, which is operated under a high voltage that may be equal to or higher than 20 V, such as 32 V.

The gate electrode 140, as described above, comprises a first portion 142 of n-type doping and two second portions 144 and 146 of p-type doping at two sides of the first portion 142. As shown in FIG. 1B, the two second portions 144 and 146 of the gate electrode 140 may be disposed above the source region 110 and the drain region 120. In some embodiments, the portions 116 and 126 of the source region 110 and the drain region 120, on which the gate dielectric 130 is disposed, are completely under the two second portions 144 and 146 of the gate electrode 140.

Figure 2A:
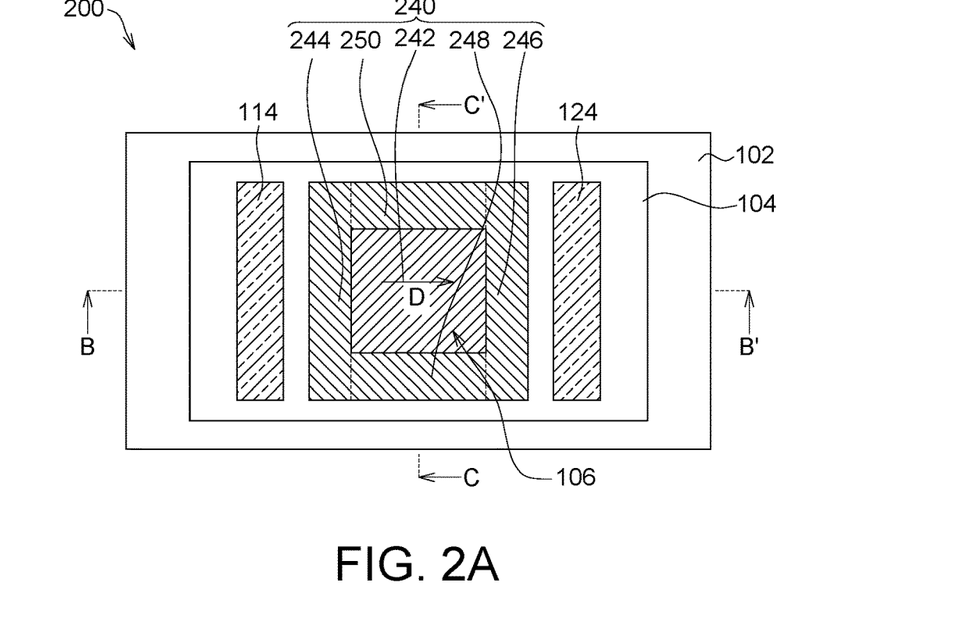
FIGS. 2A-2C show another exemplary semiconductor structure according to embodiments.
Figure 2B:
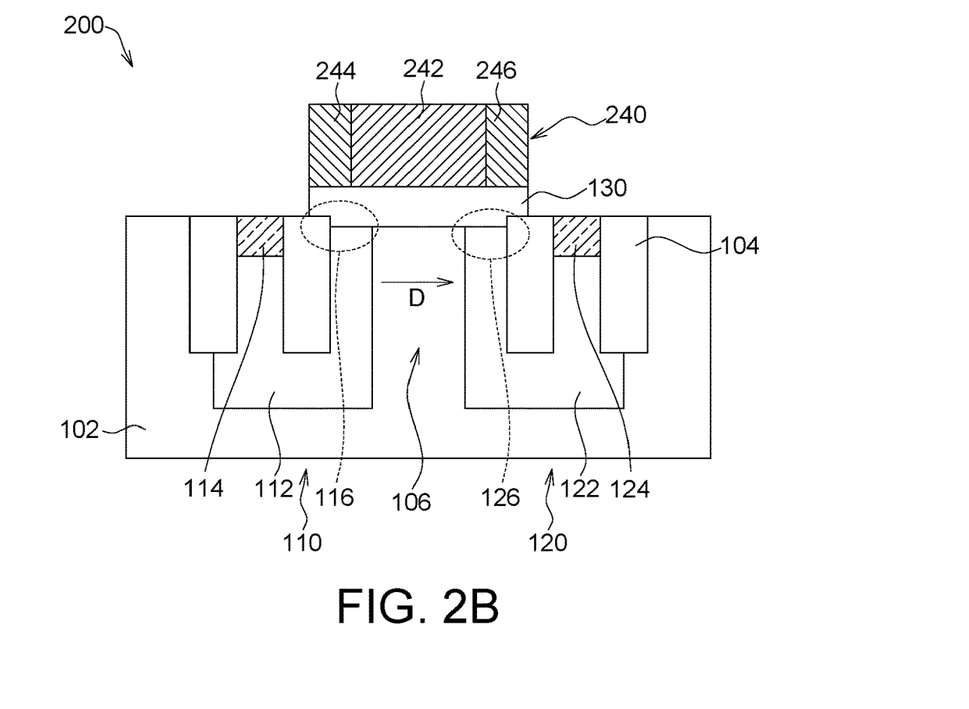
Figure 2C:
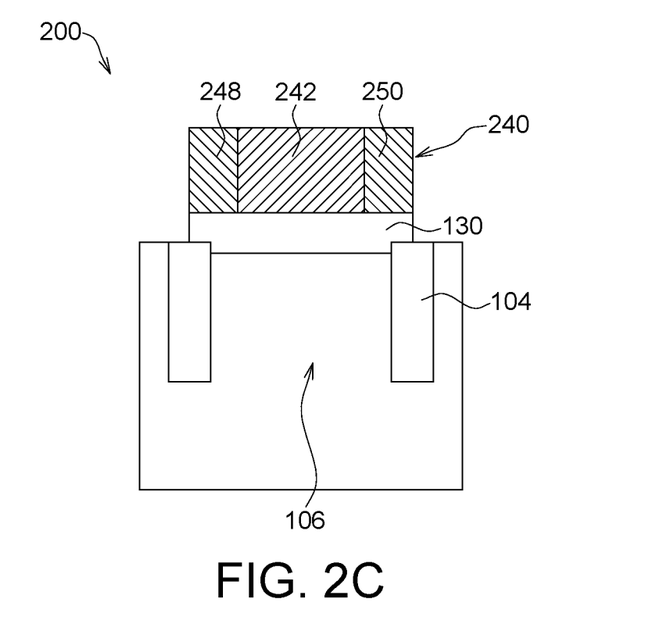

Referring to FIGS. 2A-2C, another exemplary semiconductor structure according to embodiments is shown, wherein FIG. 2A illustrates a top view, FIG. 2B illustrates a cross-sectional view along the line B-B' in FIG. 2A, and FIG. 2C illustrates a cross-sectional view along the line C-C' in FIG. 2A. This exemplary semiconductor structure comprises a HV NMOS structure 200. The HV NMOS structure 200 differs from the HV NMOS structure 100 in the configuration of the gate electrode. The gate electrode 240 of the HV NMOS structure 200 comprises a first portion 242 of n-type doping and two second portions 244 and 246 of p-type doping disposed at two sides of the first portion 242. The two second portions 244 and 246 have an extending direction perpendicular to the channel direction D. The gate electrode 240 further comprises two other second portions 248 and 250 of p-type doping at two other sides of the first portion 142. The two other second portions 248 and 250 have an extending direction parallel to the channel direction D.

Figure 3A:
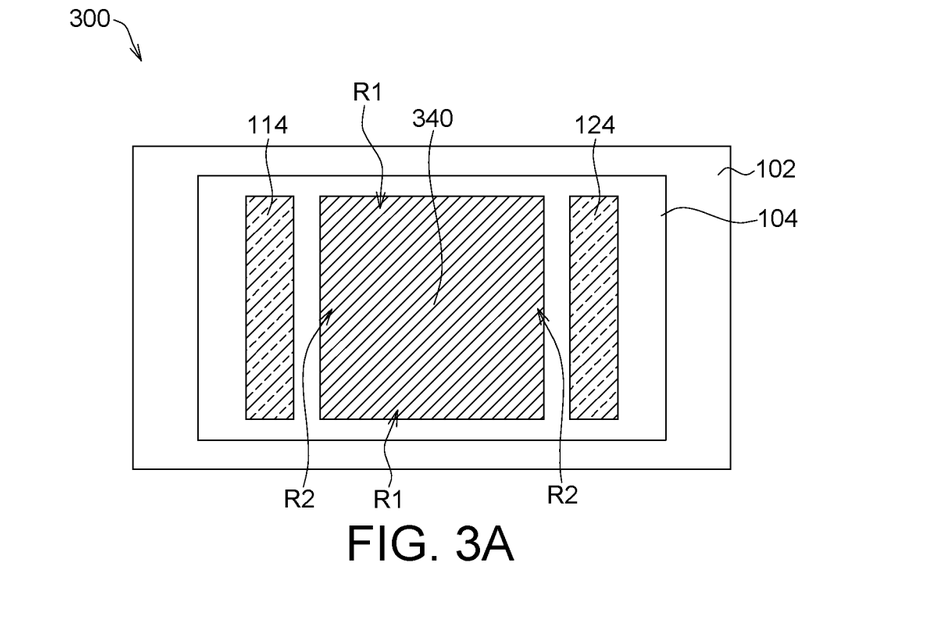
FIGS. 3A-3B show a comparative semiconductor structure and electrical features thereof.

Now referring to FIG. 3A, a comparative semiconductor structure is shown. The comparative semiconductor structure comprises a HV NMOS structure 300. The gate electrode 340 of the HV NMOS structure 300 does not comprise any second portion of p-type doping as described above. In other words, the gate electrode 340 is completely of n-type doping.

Figure 3B:
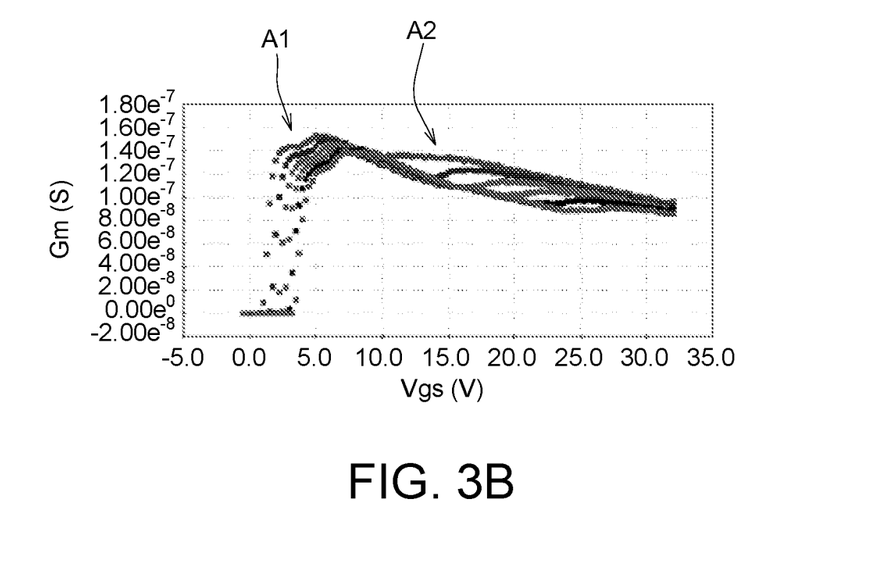

The transconductance (Gm)-gate-source voltage (Vgs) curves of the HV NMOS structure 300 with various base-source voltages (Vbs) are shown in FIG. 3B. As shown in FIG. 3B, two kinks may be observed in a Gm-Vgs curve, as indicated by arrows A1 and A2. The kink indicated by the arrow A1 may originate from a lower threshold voltage at regions R1 (FIG. 3A). It is lower than the desired threshold voltage of the HV NMOS structure, which may be properly presented by the main portion of the gate structure on the channel region. Such lower threshold voltage may be caused by the thinner thickness of the gate dielectric at the regions R1 and a segregation of the p-type dopant, such as boron, at the edge of the isolation structure, and may lead to an turn-on at edge portions of the HV NMOS structure earlier than the turn-on of the main portion of the HV NMOS structure. The kink indicated by the arrow A2 may originate from a larger threshold voltage at regions R2 (FIG. 3A). Such larger threshold voltage may be caused by a parasitic phenomenon at regions R2 between the n-type doped gate electrode 340 and the n-type doped regions of the source and drain regions, and may lead to one more turn-on of the HV NMOS structure.

The embodiments described above can solve the problems, and particular can soothe the kink indicated by the arrow A2. Referring back to FIGS. 1A-1C, in the HV NMOS structure 100, two second portions 144 and 146 of p-type doping are disposed at two sides of the first portion 142 of n-type doping. The second portions 144 and 146 extending perpendicular to the channel direction D are substantially disposed on the first and second n-type doped regions 112 and 122 of the source and drain regions 110 and 120. As such, the threshold voltage at the corresponding regions increases by about 1.4V due to the arrangement of the p-type doped second portions 144 and 146, compared to the cases in which n-type doped gate electrode are used in the corresponding regions as shown in FIG. 3A. The increase of the threshold voltage suppresses the parasitic phenomenon, and thereby soothes the kink indicated by the arrow A2.

In addition, according to some embodiments, the kink indicated by the arrow A1 may also be soothed. Referring back to FIGS. 2A-2C, in the HV NMOS structure 200, two other second portions 248 and 250 of p-type doping are disposed at two other sides of the first portion 242 of n-type doping. The second portions 248 and 250 extending parallel to the channel direction D are substantially disposed along the edges between the channel region 106 and the isolation structure 104. Such arrangement increases the threshold voltage at edge portions of the HV NMOS structure, and thereby soothes the kink indicated by the arrow A1.

Now Referring to FIGS. 4A-4F, an exemplary method for manufacturing a semiconductor structure according to embodiments is shown. The method comprises forming a HV NMOS structure, which is illustrated as the HV NMOS structure 100 for example. The formation of the HV NMOS structure comprises the following steps. It is contemplated that one or more steps may be added or removed, and/or the sequence of the steps may be changed, while they are possible.

Figure 4A:
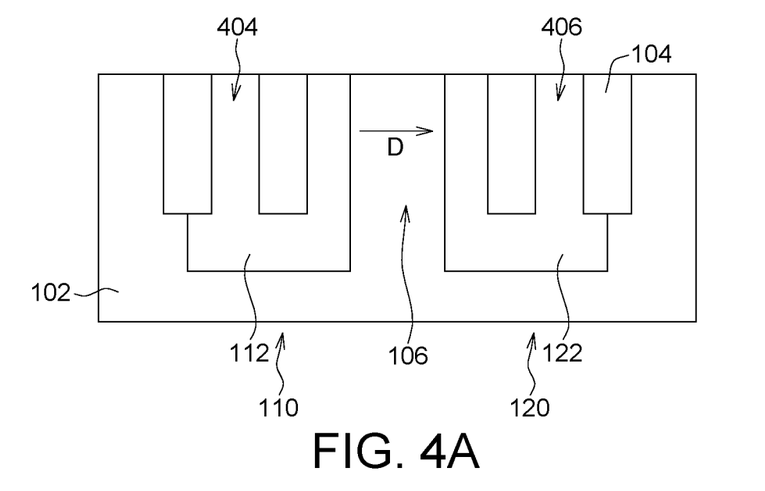
FIGS. 4A-4F show various stages of an exemplary for manufacturing a semiconductor structure according to embodiments.

As shown in FIG. 4A, a source region 110 and a drain region 120 are formed in a substrate 102. The source region 110 and the drain region 120 are separated from each other and define a channel region 106 therebetween. The channel region 106 has a channel direction D from the source region 110 toward the drain region 120. More specifically, according to some embodiments, a first n-type doped region 112 and a second n-type doped region 122 are formed in the substrate 102, which may be a p-type substrate. The first n-type doped region 112 and the second n-type doped region 122 are separated from each other. The first n-type doped region 112 is formed in the source region 110, and the second n-type doped region 122 is formed in drain region 120. An isolation structure 104, such as a shallow trench isolation (STI) structure, is formed in the substrate 102. The isolation structure 104 has a first through opening 404 and a second through opening 406 in the first n-type doped region 112 and the second n-type doped region 122, respectively.

Figure 4B:
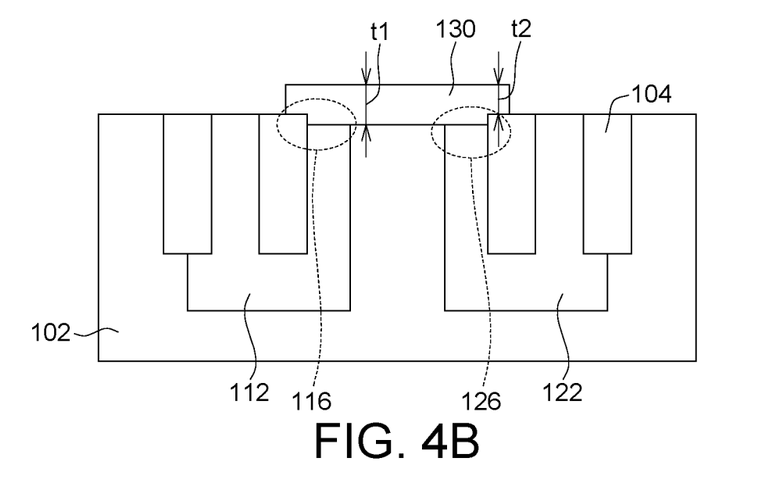

As shown in FIG. 4B, a gate dielectric 130 is formed on the channel region 106 and on a portion 116 of the source region 110 and a portion 126 of the drain region 120. The gate dielectric 130 may be formed of oxide or the like. The gate dielectric 130 has a central portion having a first thickness t1 and an edge portion having a second thickness t2 smaller the first thickness t1.

Figure 4C:
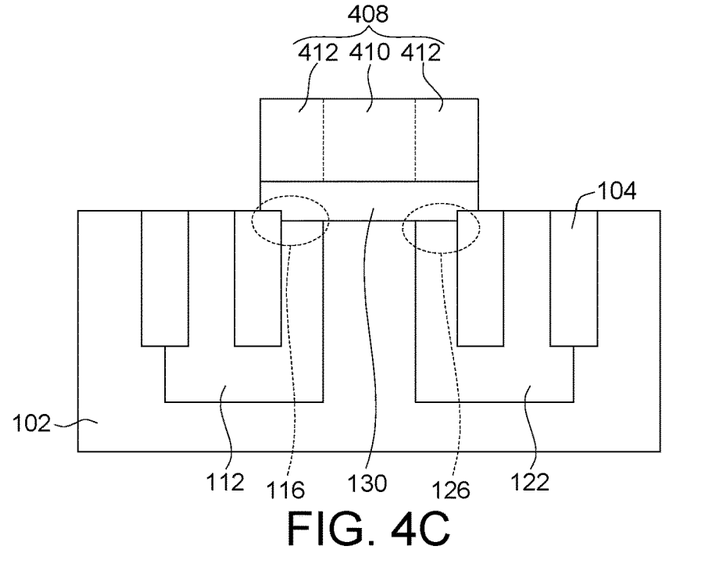

Then, a gate electrode 140 is formed on the gate dielectric 130. First, as shown in FIG. 4C, an intrinsic polysilicon layer 408 is formed on the gate dielectric 130. In the case illustrated in FIGS. 4A-4F, the intrinsic polysilicon layer 408 has a first portion 410 and two second portions 412 at two sides of the first portion 410. The two second portions 412 have an extending direction perpendicular to the channel direction D. The two second portions 412 of the intrinsic polysilicon layer 408 may be located above the source region source region 110 and the drain region 120. In some embodiments, the portions 116 and 126 of the source region 110 and the drain region 120, on which the gate dielectric 130 is disposed, are completely under the two second portions 412 of the intrinsic polysilicon layer 408. In a case in which the semiconductor structure as shown in FIGS. 2A-2C is formed, the intrinsic polysilicon layer 408 further comprises two other second portions 412 of p-type doping at two other sides of the first portion 410, and the two other second portions 412 have an extending direction parallel to the channel direction D.

Figure 4D:
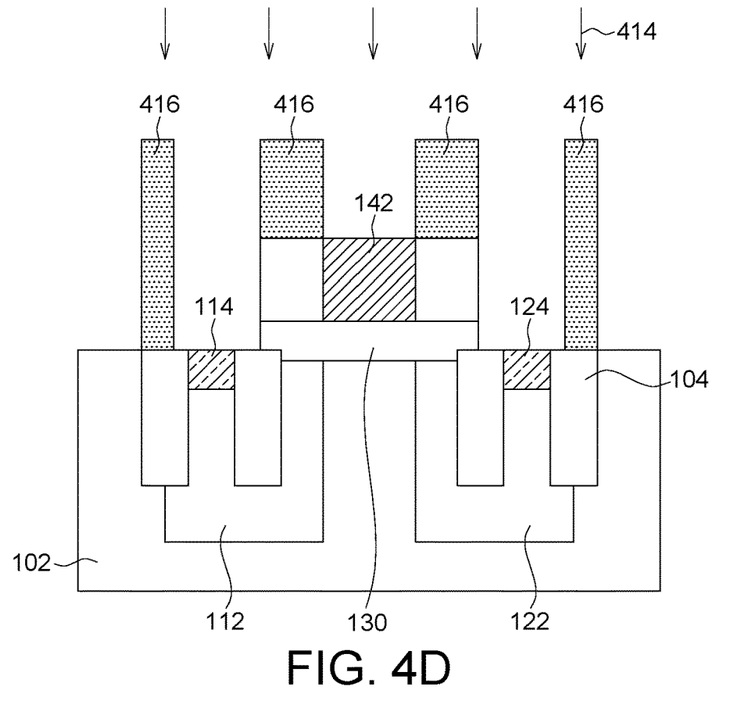

As shown in FIG. 4D, the first portion 410 of the intrinsic polysilicon layer 408 is implanted with a n-type dopant, as indicated by arrows 414, so as to form said first portion 142. A photoresist 416 may be provided on the structure, and expose the desired areas to be implanted. The n-type dopant may be selected from the group consisting of phosphorous and arsenic, and a doping concentration of the n-type dopant may be in a magnitude of $10^{-15}$ cm$^{-3}$. In some embodiments, as shown in FIG. 4D, the first n-type doped region 112 exposed by the first through opening 404 and the second n-type doped region 122 exposed by the second through opening 406 are also exposed by the photoresist 416. The first n-type doped region 112 and the second n-type doped region 122 exposed by the first through opening 404 and the second through opening 406 are implanted with the n-type dopant, so as to form a first n-type heavily doped region 114 in the source region 110 and a second n-type heavily doped region 124 in the drain region 120.

Figure 4E:
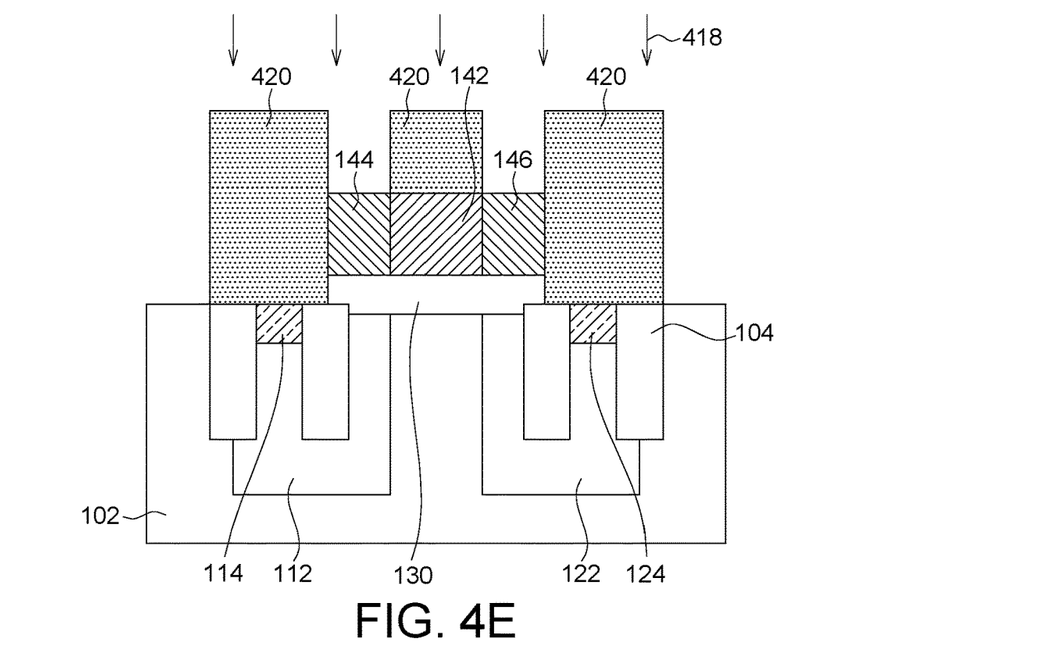

As shown in FIG. 4E, in the case illustrated in FIGS. 4A-4F, the two second portions 412 of the intrinsic polysilicon layer 408 are implanted with a p-type dopant, as indicated by arrows 418, so as to form said second portions 144 and 146. A photoresist 420 may be provided on the structure, and expose the desired areas to be implanted. The p-type dopant may be boron, and a doping concentration of the p-type dopant may be in a magnitude of $10^{-15}$ cm$^{-3}$. In a case in which the semiconductor structure as shown in FIGS. 2A-2C is formed, the two other second portions 412 as described above are also implanted with the p-type dopant at this step.

In some embodiments, the implantation steps as shown in FIG. 4D and FIG. 4E may be exchanged. Both implantation steps are typically carried out in the manufacturing process of a semiconductor structure, particularly a semiconductor device comprises both p-type and n-type doped areas, such as a semiconductor device comprises CMOS structures. As such, the second portions 144 and 146 of the gate electrode 140 can be formed by simply modifying the arrangement of photoresists 416 and 420 without any additional processing step. It can be appreciated that the first portion 142, the second portions 144 and 146, the first n-type heavily doped region 114, and the second n-type heavily doped region 124 may have doping concentrations in the same or a similar order of magnitude, and their doping concentrations are higher than the doping concentration of the first n-type doped region 112 and the second n-type doped region 122.

Figure 4F:
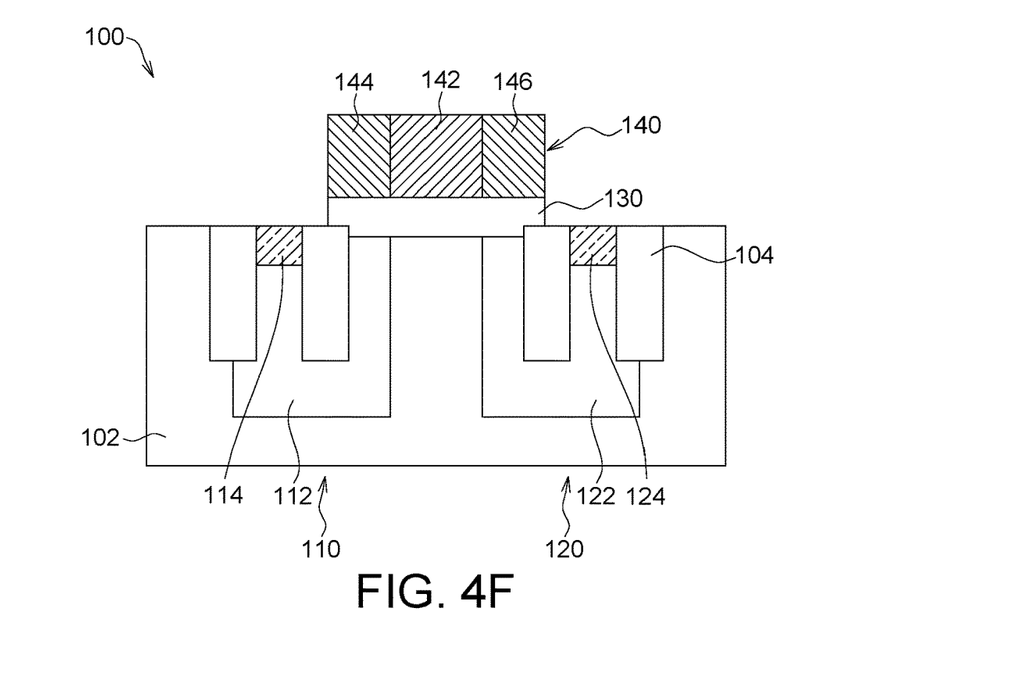

Thereafter, as shown in FIG. 4F, the photoresist 420 is removed, and a semiconductor structure comprising the HV NMOS structure 100 can be formed. It can be appreciated that further processing steps that are typically carried out in the manufacturing process of a semiconductor structure may also be conducted.

Based on the above, a semiconductor structure without being affected by the parasitic phenomenon can be provided through simple modifications of the photoresists used in implantation processes. The parasitic phenomenon is soothed by the arrangement of the p-type doped portions of the gate electrode that are at two sides of the n-type doped portion and extend perpendicular to the channel direction.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor structure, comprising:
   a high-voltage (HV) NMOS structure, comprising:
      a source region and a drain region separated from each other;
      a channel region disposed between the source region and the drain region, the channel region having a channel direction from the source region toward the drain region;
      a gate dielectric disposed on the channel region and on portions of the source region and the drain region; and
      a gate electrode disposed on the gate dielectric, the gate electrode comprising:
         a first portion of n-type doping; and
         two second portions of p-type doping disposed at two sides of the first portion, the two second portions having an extending direction perpendicular to the channel direction;
   wherein the HV NMOS structure further comprises:
      a substrate;
      a first n-type doped region and a second n-type doped region disposed in the substrate and separated from each other;
      an isolation structure disposed in the substrate, the isolation structure having a first through opening and a second through opening in the first n-type doped region and the second n-type doped region, respectively;
      a first n-type heavily doped region and a second n-type heavily doped region disposed in the first through opening and the second through opening, respectively;
      wherein the first n-type doped region and the first n-type heavily doped region are disposed in the source region, and the second n-type doped region and the second n-type heavily doped region are disposed in the drain region.

2. The semiconductor structure according to claim 1, wherein the two second portions of the gate electrode are disposed above the source region and the drain region.

3. The semiconductor structure according to claim 2, wherein the portions of the source region and the drain region, on which the gate dielectric is disposed, are completely under the two second portions of the gate electrode.

4. The semiconductor structure according to claim 1, wherein the gate dielectric has a central portion having a first thickness and an edge portion having a second thickness smaller the first thickness.

5. The semiconductor structure according to claim 1, wherein the gate electrode further comprises two other second portions of p-type doping at two other sides of the first portion, and the two other second portions have an extending direction parallel to the channel direction.

6. A method for manufacturing a semiconductor structure, comprising:
    forming a high-voltage (HV) NMOS structure, comprising:
        forming a source region and a drain region in a substrate, wherein the source region and the drain region are separated from each other and define a channel region therebetween, and the channel region has a channel direction from the source region toward the drain region;
        forming a gate dielectric on the channel region and on portions of the source region source region and the drain region; and
        forming a gate electrode on the gate dielectric, comprising:
            forming an intrinsic polysilicon layer on the gate dielectric, the intrinsic polysilicon layer having a first portion and two second portions at two sides of the first portion, wherein the two second portions have an extending direction perpendicular to the channel direction;
            implanting the first portion of the intrinsic polysilicon layer with a n-type dopant; and
            implanting the two second portions of the intrinsic polysilicon layer with a p-type dopant;
    wherein forming the HV NMOS structure further comprises:
        forming a first n-type doped region and a second n-type doped region in the substrate and separated from each other, wherein the first n-type doped region is formed in the source region, and the second n-type doped region is formed in drain region; and
        forming an isolation structure in the substrate, the isolation structure having a first through opening and a second through opening in the first n-type doped region and the second n-type doped region, respectively.

7. The method according to claim 6, wherein the two second portions of the intrinsic polysilicon layer are located above the source region source region and the drain region.

8. The method according to claim 7, wherein the portions of the source region and the drain region, on which the gate dielectric is disposed, are completely under the two second portions of the intrinsic polysilicon layer.

9. The method according to claim 6, wherein forming the HV NMOS structure further comprises:
    in implanting the first portion of the intrinsic polysilicon layer with the n-type dopant, implanting the first n-type doped region and the second n-type doped region exposed by the first through opening and the second through opening with the n-type dopant, so as to form a first n-type heavily doped region in the source region and a second n-type heavily doped region in the drain region.

10. The method according to claim 6, wherein the gate dielectric has a central portion having a first thickness and an edge portion having a second thickness smaller the first thickness.

11. The method according to claim 6, wherein, in implanting the first portion of the intrinsic polysilicon layer, the n-type dopant is selected from the group consisting of phosphorous and arsenic, and a doping concentration of the n-type dopant is in a magnitude of $10^{-15}$ cm$^{-3}$.

12. The method according to claim 6, wherein, in implanting the two second portions of the intrinsic polysilicon layer, the p-type dopant is boron, and a doping concentration of the p-type dopant is in a magnitude of $10^{-15}$ cm$^{-3}$.

13. The method according to claim 6, wherein the intrinsic polysilicon layer further comprises two other second portions of p-type doping at two other sides of the first portion, the two other second portions have an extending direction parallel to the channel direction, and forming the gate electrode further comprises:
    in implanting the two second portions of the intrinsic polysilicon layer with the p-type dopant, further implanting the two other second portions with the p-type dopant.

* * * * *